United States Patent
Gibbs

(12) 
(10) Patent No.: US 6,168,854 B1
(45) Date of Patent: Jan. 2, 2001

(54) METHOD OF MAKING A PRINTED CIRCUIT BOARD HAVING A TIN/LEAD COATING

(75) Inventor: Frank Robert Gibbs, New Milton (GB)

(73) Assignee: Nortel Networks Limited, Montreal (CA)

(*) Notice: Under 35 U.S.C. 154(b), the term of this patent shall be extended for 0 days.

(21) Appl. No.: 09/331,621

(22) PCT Filed: Dec. 22, 1997

(86) PCT No.: PCT/GB97/03532

§ 371 Date: Jun. 23, 1999

§ 102(e) Date: Jun. 23, 1999

(87) PCT Pub. No.: WO98/28958

PCT Pub. Date: Jul. 2, 1998

(30) Foreign Application Priority Data

Dec. 23, 1996 (GB) .................................................. 9626754

(51) Int. Cl.[7] .................... B32B 7/00; B05D 5/12
(52) U.S. Cl. ................ 428/209; 427/96; 427/313; 427/372.2; 428/901; 174/250
(58) Field of Search ........................ 427/96, 97, 98, 427/312, 313, 372.2; 428/901, 209; 174/250; 205/125, 126

(56) References Cited

U.S. PATENT DOCUMENTS

| | | | | |
|---|---|---|---|---|
| 4,515,829 | * | 5/1985 | Deckert et al. | 427/97 |
| 4,650,548 | * | 3/1987 | Strube et al. | 204/15 |
| 4,686,015 | * | 8/1987 | Samuels et al. | 204/15 |
| 4,804,615 | * | 2/1989 | Larson et al. | 430/314 |
| 5,358,622 | | 10/1994 | Korsten | 205/125 |

FOREIGN PATENT DOCUMENTS 5-191026  7/1993  (JP).

* cited by examiner

Primary Examiner—Brian K. Talbot
(74) Attorney, Agent, or Firm—Lee, Mann, Smith, McWilliams, Sweeney & Ohlson

(57) ABSTRACT

A method of manufacturing a printed circuit board comprising a high density conductive pattern comprising at least one pad suitable for forming a solder connection with at least one surface mounted component. The method comprises the steps of forming the pattern; and forming a protective coating on the pattern suitable for soldering without solder resist adjacent the pad. The pad can adjoin land surrounding via hole, thereby increasing density of the circuit board layout. A further process for manufacturing printed circuits applies an etch resist to a conductive pattern, etches the pattern and uses the etch resist to form a protective coating on the pattern. The etch resist may be heated to cause the etch resist to form an alloy.

15 Claims, 4 Drawing Sheets

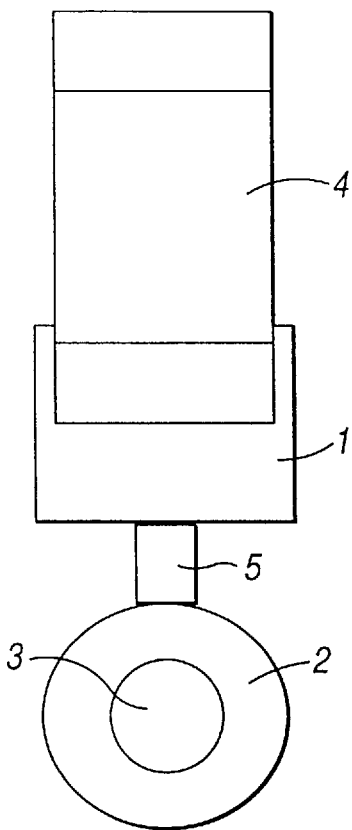
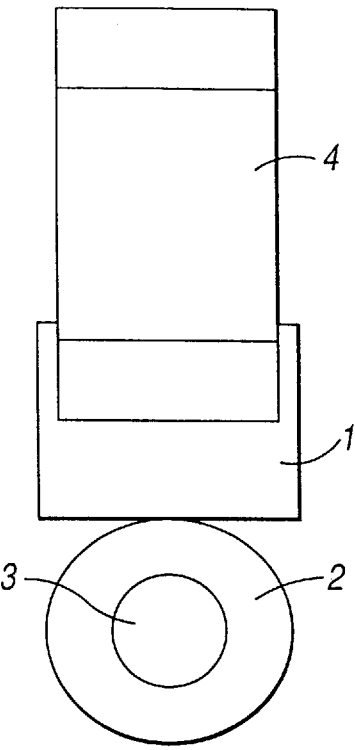
Fig.1
(PRIOR ART)
Fig.2
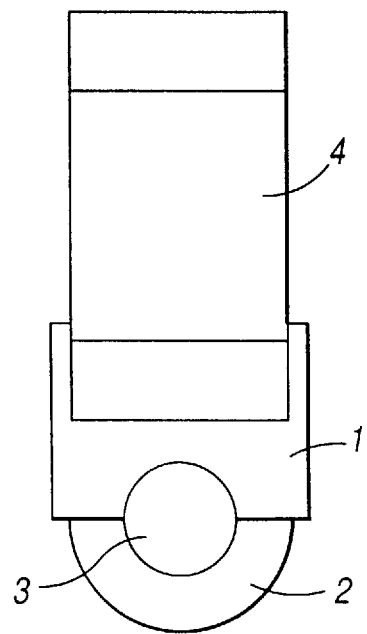
Fig.3

METHOD OF MAKING A PRINTED CIRCUIT BOARD HAVING A TIN/LEAD COATING

This Application is a 371 of PCT/GB97/03532, filed Dec. 22, 1997.

TECHNICAL FIELD

This invention relates to printed circuit boards and in particular relates to methods of manufacturing high density printed circuit boards; assembled printed circuit boards; methods of operating electronic systems comprising assembled boards; and methods of assembling high density printed circuit boards.

BACKGROUND TO THE INVENTION

The fabrication of printed circuit boards is a multi-stage process. Typically, many chemicals and materials are employed for the various stages of fabrication.

One such material is referred to as solder resist. This material is traditionally applied to the printed board to prevent solder, when liquid, from bridging between components and forming short circuits. The solder resist has a secondary function as a protective coating and can help prevent corrosion and mechanical abrasion of the conductive board tracks.

FIG. 1 is a representation of a typical prior art printed circuit board. It contains pads 1 which are connected to lands 2 surrounding via holes 3 by a short strip of conducting track 5. The location of a typical surface mounted component 4 is represented in outline. Via holes are used to form electrical connections between the various layers of double sided and multi-layer boards.

Prior art processes coat the connecting track with solder resist. The solder resist operates to impede the flow of liquid solder during the soldering process, so that liquid solder does not flow away from the pad and into the via hole. Should such a flow of solder occur, then the remaining fillet of solder between the surface mounted component and the pad would most likely have insufficient mechanical strength for a reliable joint to be formed.

The minimum distance over which this solder resist may be applied is approximately 0.2 mm. This is because the solder resist tends to break over shorter distance. Because of manufacturing tolerances connecting tracks between pads and lands are typically specified as 0.5 mm.

Circuit layouts using fine pitch surface mounted components with spacing between pads and lands of approximately 0.65 mm or less are referred to as high density layouts.

After the initial surface coating of solder resist is applied, selected areas of the board are exposed to UV light. The UV light operates to set the solder resist so that it does not react with etching chemicals. The board then undergoes a further etching process resulting in exposed areas of copper on the surface of the board. Typically these areas will be the surface mounted component pads and any other areas that are to be soldered. Accurate registration is required for this UV process, particularly on boards using fine pitch and small outline components.

Areas of copper exposed when the solder resist is removed are vulnerable to oxidisation during storage. These exposed areas are therefore coated with a protective coating, such as an antioxidant, that is stable for typical storage periods. The anti-oxidant must also be suitable for the component assembly soldering process. One such surface finish is a eutectic or near eutectic composition of tin/lead (Sn/Pb).

When Sn/Pb is used as a surface finish, it is applied by a Hot Air Solder Level process (HASL). Typically the surface of the Sn/Pb will be nonuniform. Such a surface is undesirable for the application of solder paste during the assembly process for fine pitched surface mounted components.

Due to the problems associated with the Hot Air Surface Levelling process, other flat types of material finishes are gaining popularity e.g. Electroless Ni, Immersion Au; Organo Ag; Electroless Pd; organic surface protectants; etc. These material finishes are more expensive than electroplate Sn/Pb surface finishes.

Printed Circuit Boards assembled with surface mounted components use a soldering technique referred to as a reflow soldering. The process may be described as the screen printing of solder paste onto the component pads of the board.

Reflow soldering involves heating the board above the eutectic temperature of the solder. The resultant liquid solder simultaneously wets onto the terminations of the surface mounted components and the pads, forming mechanical and electrical connections when the solder cools below its eutectic temperature.

SUMMARY OF INVENTION

The present invention seeks to reduce at least one disadvantage present in the prior art.

According to a first aspect, the present invention provides a method of manufacturing a printed circuit board comprising a high density conductive pattern comprising at least one pad suitable for forming a solder connection with at least one surface mount component; the method comprising the steps of:

1) forming the pattern by applying etch resist to discrete areas of a conductive surface of a circuit board blank and etching to form the conductive pattern having an etch resist coating; and
2) forming a protective coating on the pattern by heating the etch resist, which protective coating forms a solderable surface for receiving solder to solder the surface mount component.

The use of etch resist as a protective coating has the advantage of avoiding the conventional manufacturing steps of removing the etch resist and applying a protective coating to the exposed pattern.

The step of forming the protective coating by heating the etch resist can have the effect of liquefying the etch resist to form an alloy.

Preferably the alloy comprises a eutectic or near eutectic alloy such as a tin/lead alloy.

Preferably the etch resist layer that is applied at step 1 is thicker than the etch resist layer that would normally be applied in pcb manufacturing processes, and preferably has a thickness in the range of 5 to 15 micrometers.

In some circumstances, such as where high abrasion or insulation properties are required, it may still be desirable to apply solder resist, and solder resist can be applied over the etch resist. When a eutectic or near eutectic composition of Sn/Pb is used as an etch resist it may be necessary to selectively clear the solder resist from large areas of the pattern, such as earth/power plane areas, to minimise surface disruption of the solder resist that may be caused due to Sn/Pb reflow during the pcb assembly process.

By eliminating solder resist from areas adjacent the pads, the density of the circuit layout can be increased. Preferably the density of the pattern is such that at least some features of the pattern are spaced apart by 0.5 mm or less. Preferably the features of the pattern further comprise a via connected to one of the pads and the density of the pattern is such that the via is spaced apart from the pad by 0.5 mm or less.

Preferably the pattern comprises a land surrounding a via, the land adjoining the pad without an intermediate connecting track. The land can adjoin the pad by having the land positioned tangentially with an edge of the pad or by having the land positioned with a diameter across an edge of the pad.

Preferably two or more pads adjoin the via without the use of intermediate connecting tracks between the pads and the land. The pads may be located on opposite sides of the board. This provides further improvements in the density of the circuit layout.

Preferably the coating is formed without the solder resist being formed anywhere on the board. Eliminating solder resist from the board reduces process steps in the manufacture of the board. Preferably the step of forming the pattern comprises the step of applying etch resist and wherein the etch resist is used in the step of forming the coating. This further reduces the number of steps in the manufacturing process.

A further aspect the present invention provides a high density printed circuit board comprising a high density conductive pattern comprising at least one pad suitable for forming a solder connection with a surface mount component, the pattern having a protective coating which has been formed by heating an etch resist coating that was used in etching the conductive pattern, the protective coating having a solderable surface for receiving solder to solder the surface mount component.

Further aspects of the present invention provide an assembled high density printed circuit board that has been manufactured according to the above method and a method of assembling such a board.

Preferred features may be combined and may be combined with any of the aspects of the invention as appropriate, as would be apparent to a skilled person.

BRIEF DESCRIPTION OF THE DRAWINGS

In order that a greater understanding of the invention be attained, reference will now be made to the accompanying Figures, wherein:

FIG. 1 is a representation of a land surrounding a via hole that is separated from a pad by a short conducting track.

FIG. 2 is a high density arrangement of a land surrounding a via hole tangentially connected with a pad.

FIG. 3 is a high density arrangement of a land surrounding a via hole connected with a pad across a diameter.

DETAILED DESCRIPTION

Figure 4:
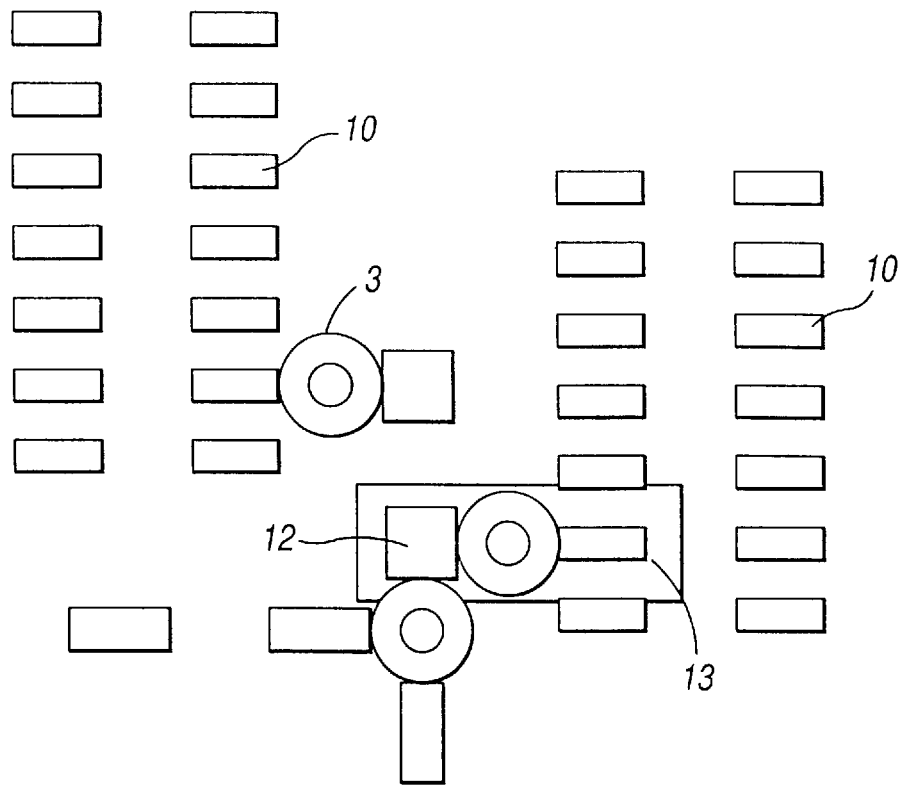
FIG. 4 is an example of a portion of a typical high density circuit layout according to the present invention.

The invention will now be described with reference to the accompanying drawings. The skilled addressee will appreciate that the invention is not limited to embodiments described herein and that the scope of the patent envisages variations to these embodiments falling within the scope of the claims.

According to the present invention it is believed that surface tension effects of liquid solder can be utilised to allow printed circuit boards to be soldered independently of solder resist. For soldering operations such as reflow soldering, these surface tension effects may be achieved with stencils having thickness typically in the range of 0.10 mm to 0.25 mm.

Referring now to FIG. 2, which depicts an arrangement independent of solder resist. It has been found that the surface tension effects are sufficient that lands 2 can be positioned tangentially with the edge of a pad 1. Preferably a CAD layout overlays a track of 0.2 mm (0.008") between the tangentially connected land and pad of FIG. 2. Where this arrangement was used, only a small amount of solder flowed onto the land. This small flow of solder was not found to effect mechanical or electrical properties of the solder fillet.

Using the arrangement of FIG. 2, fillets having mechanical strength of on average 50.8 Newtons shear stress with standard deviation of 5.8 over a sample size of 16 '0805' type resistors from solder paste applied with a stencil thickness of 0.2 mm (0.008")) were measured. Fillets having mechanical strength of on average 25.0 Newtons shear stress with standard deviation of 2.32 over a sample size of 16 '1206' type capacitors from solder paste applied with a stencil thickness of 0.2 mm (0.008") were measured.

Referring now to FIG. 3, the land 2 is located with a diameter across an edge of a pad 1. With this arrangement a limited amount of solder was found to flow into via 3. This flow of solder resulted in a fillet having slightly reduced mechanical strength over the arrangement where the land is located tangential to the pad.

Using the arrangement of FIG. 3, fillets having mechanical strength of on average 40.5 Newtons shear stress with standard deviation of 3.6 over a sample size of 16 '0805' type resistors from solder paste applied with a stencil thickness of 0.2 mm (0.008") were measured. Fillets having mechanical strength of on average 20.0 Newtons shear stress with standard deviation of 2.8 over a sample size of 16 '1206' type capacitors from solder paste applied with a stencil thickness of 0.2 mm (0.008") were measured.

FIG. 4 is an example of surface mounted component pad configurations that can be achieved with the present invention. The layout may be described as a high density layout. It includes two Small Outline Integrated Circuits (SOIC)/ Quad Flat Pack (QFP) 10. Each SOIC/QFP is separated from a discrete surface mounted chip component 12 such as a capacitor or resistor, by a via hole and land arrangement 13. The via hole and land arrangement 13 being tangential to the pad of the surface mounted component 10.

Such close spacing can be achieved because one aspect of the invention allows circuits to be constructed independent of solder resist material. A further advantage of the present invention is that it allows components on alternate sides of a printed circuit board to share via holes. An example of this is depicted in FIG. 5.

Figure 5:
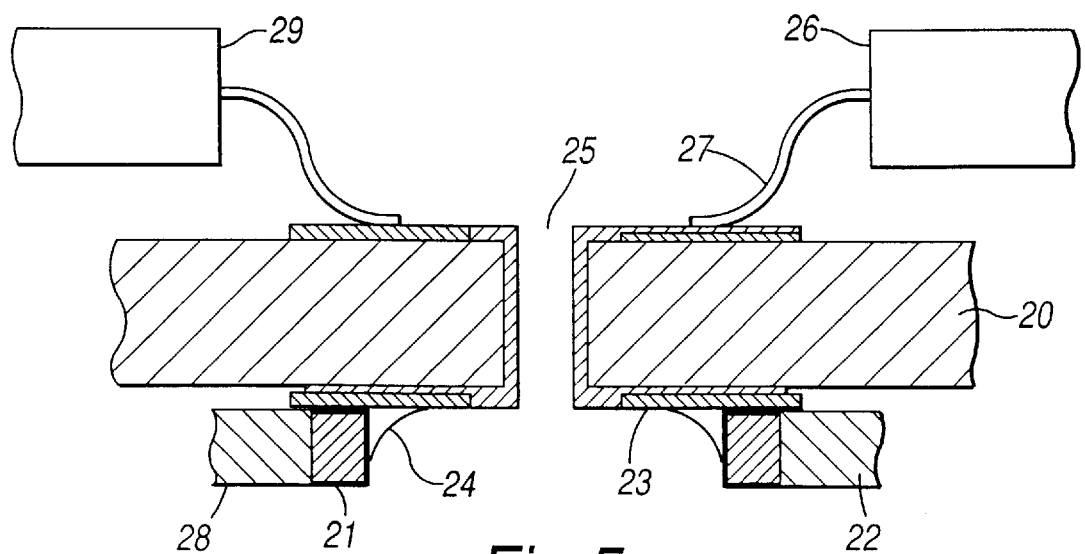
FIG. 5 is a high density double sided board with components sharing a via hole.

Referring now to FIG. 5, printed circuit board 20 contains via hole 25 and discrete components 22, 26, 28 & 29. Components 22 and 28 are small outline discrete components, such as a resistor or a capacitor. Components 26 & 29 are small outline integrate circuits (SOIC) or quad flat pack (QFP) components. Both 26 and 29 are connected to pad 23 by lead 27 and a solder fillet (not shown for clarity). These four components are electrically connected by via hole 25. The components are located on conducting pads 23. An electrical connection is formed between the pad 23 and the termination 21 of components 22 & 28 by solder fillet 24.

A process for manufacturing printed circuit boards for use with high density surface mounted components that are reflow soldered, will now be described. These boards are fabricated independent of solder resist materials and preferably independent of post solder resist surface finish.

Figures 6, 7:
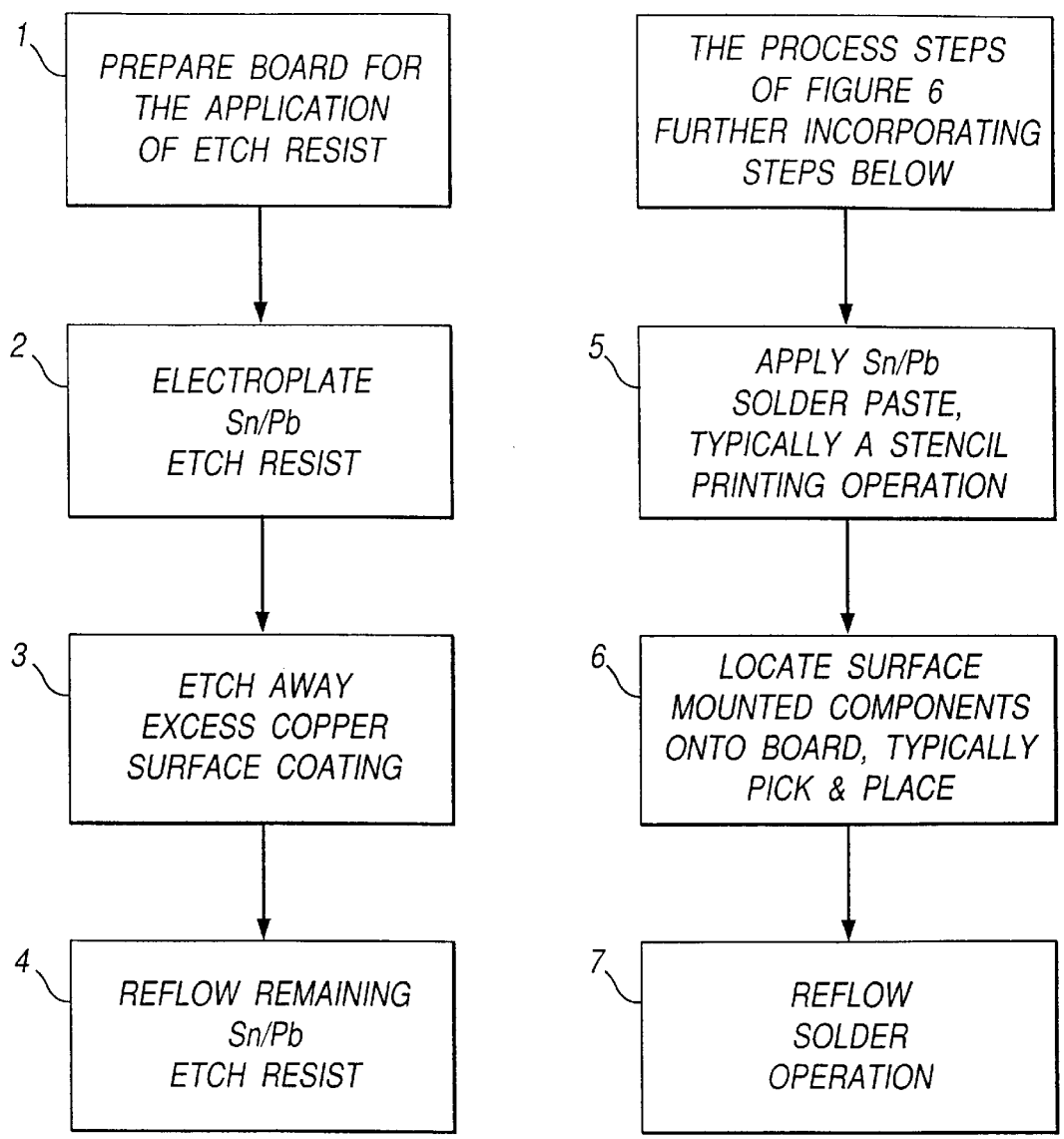
FIG. 6 is a flow chart of the process of the invention for manufacturing printed circuit boards.
FIG. 7 is a flow chart of a process for assembling electrical circuits using the present invention.

According to one preferred embodiment, this is achieved by using an etch resist adapted to protect these conductive areas against corrosion and preferably mechanical abrasion. FIG. 6 is a process chart for a preferred embodiment of this aspect of the invention.

Step 1 of the process in FIG. 6 is the preparation of the copper coated laminar board (often referred to as a blank) for plating with eutectic or near eutectic tin/lead (Sn/Pb) etch resist. The preparation of the blank for the plating of etch resist material may be performed according to standard methods known in the art.

Step 2 of FIG. 6, provides that after the board is prepared, a mixture of Sn/Pb is plated to the blank. The Sn/Pb plate is located in the areas that will form conductive areas on the surface of the board, such as tracks, lands, pads, etc.

Step 3 of FIG. 6, etches the blank causing copper not protected by the etch resist to be removed. Prior art methods typically apply between approximately 5 and 6 micrometers of Sn/Pb etch resist for this etching process. In these prior-art process, the Sn/Pb etch resist is removed in a secondary process, before solder resist is applied to the surface of the board.

A number of etch resist materials may be used by the present invention. A preferred embodiment uses Sn/Pb as an etch resist. Between 5 and 15 micrometers of Sn/Pb etch resist may be applied to the board and preferably between 8 and 10 micrometers is applied. The Sn/Pb plate is preferably applied in a eutectic or near eutectic ratio of 63% Tin (Sn) to 37% Lead (Pb). Excess copper not protected by the etch resist is then removed.

The present invention retains the etch resist on the surface of the board. It is utilised as a protective coating for the printed circuit board tracks. Preferably the etch resist used will also form a solderable surface. By forming a solderable surface, additional process steps of removing the etch resist from areas to be soldered and coating these areas with a solderable surface finish may be avoided.

Sn/Pb plated onto the surface of a board is vulnerable to corrosion and mechanical abrasion as the Sn/Pb does not form an alloy from the plating process. The two metals must be mixed in the liquid state for this to occur.

Accordingly, the final step in the process of FIG. 6 is reflowing of the Sn/Pb plating. Reflowing is the heating of a metallic mixture, such as the preferred eutectic or near eutectic Sn/Pb mixture, so that the constituents become liquid. The liquid metals interact and upon cooling, an alloy is formed. This alloy operates to protect the conductive areas from corrosion and mechanical abrasion more effectively than plated Sn/Pb. The Sn/Pb also forms a solderable surface which reduces the need for separate surface finishes for areas of the board that are to be soldered.

A further advantage of the of reflowing the Sn/Pb plating is that a uniform surface finish typically results. Surface tension effects on the liquid Sn/Pb may cause the surface of the cooled Sn/Pb alloy to be slightly convex. However the preferred thickness of the Sn/Pb of between 8 and 10 micrometers is small compared to typical surface mount component pad widths. Accordingly the convex alloy surface is flat compared to the width of the track. It is also substantially uniform across that surface of the surface mounted component pads across the whole of the printed circuit board. This substantially flat and uniform surface is suitable for the application of solder paste during assembly of the electric circuit.

Preferably, the Sn/Pb plated etch resist is reflowed in a long wave infra-red oven or convection reflow oven. These heating processes providing uniform heating of the printed circuit board.

Figure 8:
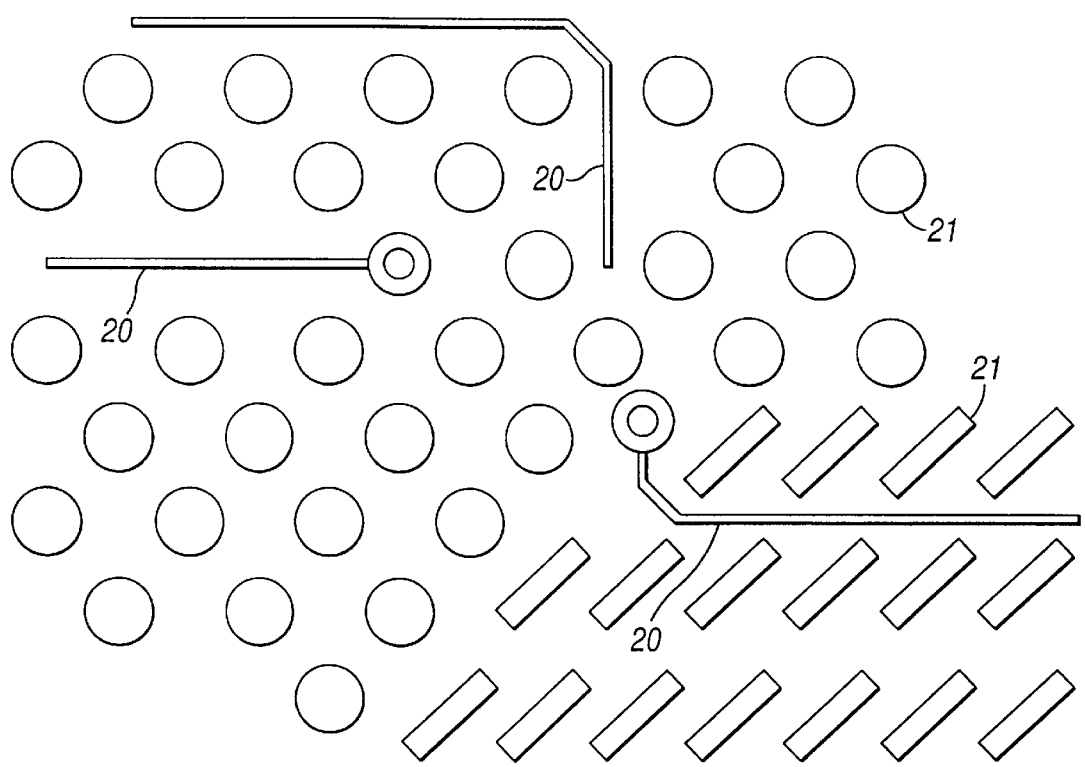
FIG. 8 is a circuit board layout for protecting isolated tracks.

Isolated tracks on the board may be protected from mechanical abrasion by locating a plurality of unconnected areas adjacent to the tracks in question. Such an arrangement is depicted in FIG. 8. It comprises an isolated track 20, which is surrounded by a plurality of unconnected areas 21. The unconnected areas 21 have a depth equal to, or greater than, the depth of the isolated track 20. Both the isolated track 20 and the unconnected areas 21 are plated with reflowed Sn/Pb alloy according to the process described above. Should the board rub against an abrasive surface, the unconnected areas serve to protect the isolated track.

Other structures for the unconnected areas 21 may be used. Such structures can be diagonal portions either side of a protected track.

FIG. 7 describes the process of making an electric circuit incorporating a printed circuit board of FIG. 6. It includes the first four steps of FIG. 6 as described above. Step 5 of FIG. 7 is the application of solder paste to the pad areas of the board.

The paste is applied according to a standard stencil printing techniques familiar to the skilled person in the art of printed circuit board fabrication. Preferably stencils with thickness between 0.15 and 0.2 mm are used, although this may vary depending on the pitch of components employed in the circuit.

In step 6, the surface mounted components are located onto the board according to standard techniques. The flux in the solder paste, being partially adhesive, operates to hold the surface mounted components in place for the soldering operation.

In step 7, a reflow soldering operation is performed. Reflow soldering heats that board and components above the eutectic temperature of the solder paste, causing it to turn into a liquid. After cooling, a mechanical and an electrical connection is formed between the pad and the surface mounted component.

A final stage in the process is a washing process which removes flux residues. In a typical process of this type, An aluminium oxide abrasive is mixed with water. Nylon brushes are used on the surface of the board, which in combination with the abrasive fluid, remove flux residue.

What is claimed is:

1. A method of manufacturing a printed circuit board comprising a high density conductive pattern comprising at least one pad suitable for forming a solder connection with at least one surface mount component; the method comprising the steps of:

1) forming the pattern by applying etch resist to discrete areas of a conductive surface of a circuit board blank and etching to form the conductive pattern having an etch resist coating; and, 2) forming a protective coating on the pattern by heating the etch resist, which protective coating forms a solderable surface for receiving solder to solder the surface mount component.

2. The method of claim 1 further comprising forming the pattern such that the density of the pattern has at least some features of the pattern spaced apart by 0.5 mm or less.

3. The method of claim 1 further comprising forming the pattern such that the pattern comprises a via connected to one of the pads and the density of the pattern is such that the via is spaced apart from the pad by 0.5 mm or less.

4. The method of claim 1 further comprising forming the pattern such that the pattern comprises a land surrounding a via, the land adjoining the pad without an intermediate connecting track.

5. The method of claim 4 further comprising forming the pattern such that the land is positioned tangentially with an edge of the pad.

6. The method of claim 4 further comprising forming the pattern such that the land is positioned with a diameter across an edge of the pad.

7. The method of claim 4 further comprising forming the pattern such that the two pads adjoin the via.

8. A method for manufacturing a printed circuit board as claimed in claim 1 wherein said protective coating comprises an alloy.

9. A method for manufacturing a printed circuit board as claimed in claim 1 wherein step 2) comprises liquefying said etch resist whereby forming an alloy.

10. A method for manufacturing a printed circuit board as claimed in claim 8 wherein said alloy comprises a eutectic or near eutectic alloy.

11. A method for manufacturing a printed circuit board as claimed in claim 10 wherein said alloy comprises a tin/lead alloy.

12. A method for manufacturing a printed circuit board as claimed in claim 8 wherein said thickness of said alloy is in the range of 5 to 15 micrometers.

13. A high density printed circuit board comprising a high density conductive pattern comprising at least one pad suitable for forming a solder connection with a surface mount component, the pattern having a protective coating which has been formed by heating an etch resist coating that was used in etching the conductive pattern, the protective coating having a solderable surface for receiving solder to solder the surface mount component.

14. An assembled high density printed circuit board comprising a board according to claim 13 and at least one surface mounted component soldered to the pad.

15. A method of assembling a high density printed circuit comprising the step of soldering surface mount components to a board manufactured according to the method of claim 1.

* * * * *